United States Patent
Park et al.

(10) Patent No.: US 7,109,650 B2
(45) Date of Patent: Sep. 19, 2006

(54) ACTIVE MATRIX ORGANIC ELECTROLUMINESCENT DISPLAY DEVICE AND METHOD OF FABRICATING THE SAME

(75) Inventors: Jae-Yong Park, Gyeonggi-do (KR); Choong-Keun Yoo, Incheon (KR); Ock-Hee Kim, Gyeonggi-do (KR); Tae-Joon Ahn, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 117 days.

(21) Appl. No.: 10/606,926

(22) Filed: Jun. 27, 2003

(65) Prior Publication Data
US 2004/0080266 A1 Apr. 29, 2004

(30) Foreign Application Priority Data
Jul. 8, 2002 (KR) .................. 10-2002-0039259

(51) Int. Cl.
*H01L 51/50* (2006.01)
*H01L 51/56* (2006.01)
*H05B 33/08* (2006.01)
*H05B 33/22* (2006.01)

(52) U.S. Cl. ............... 313/504; 313/506; 313/509; 313/503; 445/24; 445/25

(58) Field of Classification Search ............... 313/500, 313/505, 504, 503, 506, 509
See application file for complete search history.

(56) References Cited

U.S. PATENT DOCUMENTS

| | | | |
|---|---|---|---|
| 5,264,483 A | 11/1993 | Hallden-Abberton et al. | |
| 6,072,450 A * | 6/2000 | Yamada et al. | 313/500 |
| 6,246,179 B1 * | 6/2001 | Yamada | 315/169.3 |
| 6,420,834 B1 * | 7/2002 | Yamazaki et al. | 315/169.3 |
| 6,597,121 B1 * | 7/2003 | Imura | 313/500 |
| 6,642,544 B1 * | 11/2003 | Hamada et al. | 313/505 |
| 2001/0004190 A1 * | 6/2001 | Nishi et al. | 313/506 |
| 2001/0026125 A1 | 10/2001 | Yamazaki et al. | |
| 2001/0028057 A1 | 10/2001 | Tanaka et al. | |
| 2002/0011597 A1 | 1/2002 | Fujimoto et al. | |
| 2002/0167032 A1 * | 11/2002 | Umeda et al. | 257/310 |

(Continued)

FOREIGN PATENT DOCUMENTS

EP        0 717 439        6/1996

(Continued)

*Primary Examiner*—Mariceli Santiago
(74) *Attorney, Agent, or Firm*—Morgan, Lewis & Bockius, LLP

(57) ABSTRACT

An active matrix organic electroluminescent display device includes a substrate including a light emitting region having sub pixel regions, a plurality of switching elements on the substrate in the sub pixel regions, a first passivation layer covering the plurality of switching elements and having a plurality of first contact holes exposing the plurality of switching elements, a plurality of first electrodes on the first passivation layer, each first electrode connected to each switching element through each first contact hole, a second passivation layer on the plurality of first electrodes, the second passivation layer having a plurality of openings exposing the plurality of first electrodes and covering edge portions of the plurality of first electrodes, a plurality of organic electroluminescent layers on the second passivation layer, each organic electroluminescent layer contacting each first electrode through each opening, and a second electrode on the plurality of organic electroluminescent layers, wherein the first passivation layer is made of a first organic material having a planarized upper surface and the second passivation layer is made of a second organic material having a formation temperature lower than a formation temperature of inorganic materials.

23 Claims, 5 Drawing Sheets

U.S. PATENT DOCUMENTS

2002/0180371 A1  12/2002  Yamazaki et al.
2003/0127657 A1   7/2003  Park
2003/0201716 A1* 10/2003  Yamazaki et al. .......... 313/506

FOREIGN PATENT DOCUMENTS

| EP | 0 717 445 | 6/1996 |
|---|---|---|
| EP | 0 940 796 | 9/1999 |
| EP | 0 940 797 | 9/1999 |
| EP | 1 128 436 | 8/2001 |
| EP | 1 253 643 | 10/2002 |
| KR | 2002-0050718 | 6/2002 |

* cited by examiner

ACTIVE MATRIX ORGANIC ELECTROLUMINESCENT DISPLAY DEVICE AND METHOD OF FABRICATING THE SAME

The present invention claims the benefit of Korean Patent Application No. P2002-039259 filed in Korea on Jul. 8, 2002, which is hereby incorporated by reference.

BACKGROUND OF THE INVENTION

1. Field of the Invention

The present invention relates to an organic electroluminescent display device and a method of fabricating an organic electroluminescent display device, and more particularly, to an active matrix organic electroluminescent display device and a method of fabricating an active matrix organic electroluminescent display device.

2. Discussion of the Related Art

Among flat panel displays, liquid crystal display (LCD) devices have been commonly used due to their thin profile, light weight, and low power consumption. However, the LCD devices are not self-luminescent and suffer from low brightness, low contrast ratio, narrow viewing angle, and large overall size.

Organic electroluminescent display (OELD) devices have wide viewing angles and excellent contrast ratios because of their self-luminescence. In addition, since the OELD devices do not require additional light sources, such as a backlight, the OELD devices have relatively small size, are light weight, and have low power consumption, as compared the LCD devices. Furthermore, the OELD devices can be driven by low voltage direct current (DC) and have short microsecond response times. Since the OELD devices are solid phase devices, the OELD devices sufficiently withstand external impacts and have greater operational temperature ranges. In addition, the OELD devices may be manufactured at low cost since only deposition and encapsulation apparatus are necessary for manufacturing the OELD devices, thereby simplifying manufacturing processes.

The OELD devices may be categorized as passive matrix-type OELD devices and active matrix-type OELD devices depending upon a method of driving the devices. The passive matrix-type OELD devices are commonly used due to their simplicity and ease of fabrication. However, the passive matrix-type OELD devices have scanning lines and signal lines that perpendicularly cross each other in a matrix configuration. Since a scanning voltage is sequentially supplied to the scanning lines to operate each pixel, an instantaneous brightness of each pixel during a selection period should reach a value resulting from multiplying an average brightness by the number of the scanning lines to obtain a required average brightness. Accordingly, as the number of the scanning lines increases, the applied voltage and current also increase. Thus, the passive matrix-type OELD devices are not adequate for high resolution display and large-sized areas since the device easily deteriorates during use, and power consumption is high.

Since the passive matrix-type OELD devices have many disadvantages with regard to image resolution, power consumption, and operational lifetime, the active matrix-type OELD device have been developed to produce high resolution images in large display area displays. In the active matrix-type OELD devices, thin film transistors (TFTs) are disposed at each sub-pixel for use as a switching element to turn each sub-pixel ON and OFF. A first electrode connected to the TFT is turned ON/OFF by the sub-pixel, and a second electrode facing the first electrode functions as a common electrode. In addition, a voltage supplied to the pixel is stored in a storage capacitor, thereby maintaining the voltage and driving the device until a voltage of next frame is supplied, regardless of the number of the scanning lines. As a result, since an equivalent brightness is obtained with a low applied current, an active matrix-type OELD device has low power consumption and high image resolution over a large area.

FIG. 1 is a schematic circuit diagram of a pixel structure of an active matrix-type OELD device according to the related art. In FIG. 1, a scanning line 1 is arranged along a first direction, and a signal line 2 and a power line 3 that are spaced apart from each other are arranged along a second direction perpendicular to the first direction. The signal line 2 and the power line 3 cross the scanning line 1, thereby defining a pixel area. A switching thin film transistor (TFT) $T_S$, i.e., an addressing element, is connected to the scanning line 1 and the signal line 2, and a storage capacitor $C_{ST}$ is connected to the switching TFT $T_S$ and the power line 3. A driving thin film transistor (TFT) $T_D$, i.e., a current source element, is connected to the storage capacitor $C_{ST}$ and the power line 3, and an organic electrolumninescent (EL) diode $D_{EL}$ is connected to the driving TFT $T_D$. When a forward current is supplied to the organic EL diode $D_{EL}$, an electron and a hole are recombined to generate an electron-hole pair through the P(positive)-N(negative) junction between an anode, which provides the hole, and a cathode, which provides the electron. Since the electron-hole pair has an energy that is lower than the separated electron and hole, an energy difference exists between the recombination and the separated electron-hole pair, whereby light is emitted due to the energy difference.

In FIG. 1, when a scanning signal is supplied to the corresponding scanning line 1, the switching TFT $T_S$ is turned ON, and a data signal from the signal line 2 is supplied to the driving TFT $T_D$. Then, the driving TFT $T_D$ is turned ON, and current from the power line 3 flows to the organic EL diode $D_{EL}$ after passing through the driving TFT $T_D$. Thus, light is emitted from the organic EL diode $D_{EL}$.

Since an ON ratio of the driving TFT $T_D$ depends on a value of the data signal, gray scales can be displayed by controlling the current flowing through the driving TFT $T_D$. In addition, although the data signal is not supplied, the organic EL diode $D_{EL}$ emits light due to data stored in the storage capacitor $C_{ST}$ until the next data signal is supplied.

FIG. 2 is a cross sectional view of an active matrix-type OELD device according to the related art. In FIG. 2, a buffer layer 12 is formed on a substrate 10, which includes a light emitting region E for forming images. A thin film transistor T, which may be the driving thin film transistor, is formed on the buffer layer 12. An organic EL diode $D_{EL}$ is formed in the light emitting region E and is connected to the thin film transistor T, and a storage capacitor $C_{ST}$ is formed to be connected to the thin film transistor T.

In FIG. 2, a semiconductor layer 14 and a first capacitor electrode 16, which are spaced apart, are formed on the buffer layer 12, and a gate insulating layer 18 and a gate electrode 20 are subsequently formed on a central portion of the semiconductor layer 14. Then, a first interlayer 22 is formed on an entire surface of the substrate 10 to cover the gate electrode 20 and the first capacitor electrode 16. Next, a second capacitor electrode 24 is formed on the first interlayer 22 corresponding to the first capacitor electrode 16, wherein the second capacitor electrode 24 branches off from a power line (not shown). Then, a second interlayer 26 is formed on an entire surface of the substrate 10 including the second capacitor electrode 24.

The semiconductor layer 14 is composed of an active region A, which corresponds to the gate insulating layer 18 and the gate electrode 20, and source and drain regions S and D, which are disposed at both sides of the active region A, respectively. A first contact hole 28 and a second contact hole 30 are formed through the first interlayer 22 and the second interlayer 26 to expose the source region S and the drain region D of the semiconductor layer 14, respectively. In addition, a third contact hole 32 is formed only through the second interlayer 26 to expose the second capacitor electrode 24.

A source electrode 34 and a drain electrode 36 are formed on the second interlayer 26, spaced apart from each other. Accordingly, the source electrode 34 is connected to both the source region S of the semiconductor layer 14 through the first contact hole 28 and the second capacitor electrode 24 through the third contact hole 32, and the drain electrode 36 is connected to the drain region D of the semiconductor layer 14 through the second contact hole 30.

A first passivation layer 40 is formed on an entire surface of the substrate 10 including the source electrode 34 and the drain electrode 36, wherein the first passivation layer 40 has a fourth contact hole 38 exposing the drain electrode 36. A first electrode 42 is formed in the light emitting region E on the first passivation layer 40, and is connected to the drain electrode 36 through the fourth contact hole 38. Although not shown, the first electrode 42 is patterned in each sub pixel area, which is a minimum unit for forming an image.

A second passivation layer 46 is formed on the first electrode 42, and the second passivation layer 46 has an opening 44 exposing the first electrode 42. Accordingly, it is difficult to form the first electrode 42 having a uniform thickness due to step coverage characteristics of the layers under the first electrode 42. Thus, an electric field is concentrated on edges of the first electrode 42, whereby leakage current may be generated. To prevent the leakage current, the second passivation layer 46 covers the edges of the first electrode 42. Then, an organic electroluminescent layer 48 is formed on the second passivation layer 46 in the light emitting region E, and a second electrode 50 is formed on an entire surface of the substrate 10 including the organic electroluminescent layer 48.

The first passivation layer 40 insulates the first electrode 42 from the layers under the first electrode 42, and prevents damage of the under layers since the first passivation layer 40 may be made of an inorganic material, such as silicon oxide ($SiO_2$) and silicon nitride (SiNx), or an organic material, such as an acrylic resin. In addition, the second passivation layer 46 may have a bank shape in order to prevent leakage current and an electrical short due to step coverages in the peripheral portion of the first electrode 42, and in order to reduce parasitic capacitances between the second electrode 50 and a gate line (not shown), i.e., the scanning line of FIG. 1, and between the second electrode 50 and a data line (not shown), i.e., the signal line of FIG. 1.

Additionally, if the first passivation layer 40 is made of an inorganic material, such as silicon oxide and silicon nitride, the first passivation layer 40 is deposited along the shape of the second interlayer 26, and surface roughness of the first passivation layer 40 increases. Thus, characteristics of the first electrode 42 on the first passivation 40 are lowered. In addition, the first electrode 42 is formed by a plasma enhanced chemical vapor deposition (PECVD) method, which deposits a thin film by decomposing reaction gas molecules by collision with electrons having high energy in plasma and sticking decomposed gas atoms to the surface of a substrate, or by a sputtering method, which deposits a thin film by colliding ions of high energy against a target of a solid phase and detaching atoms and molecules from the target. Thus, the first electrode 42 may have poor surface planarization. Therefore, bumps or peaks may be easily formed on the surface, and the organic electroluminescent device may not have normal operation due to leakage current from the bumps or the peaks. Accordingly, the number of pixels that do not emit light increases as using time passes, and the lifetime of the device may be shortened.

In addition, if the second passivation layer 46 is made of an inorganic material, to form the opening 44, the second passivation layer 46 may be etched through a dry etching process using a gas mixture of SF6 and O2 or CF4 and O2. At this time, if the first electrode 42 is made of indium-tin-oxide (ITO), which is a transparent conducting material, it is not easy to control the Fermi level of the first electrode 42 as expected because of the gas mixture.

SUMMARY OF THE INVENTION

Accordingly, the present invention is directed to an active matrix organic electroluminescent device and a method of fabricating the same that substantially obviates one or more of the problems due to limitations and disadvantages of the related art.

An object of the present invention is to provide an active matrix organic electroluminescent display device having improved endurance and reliability.

Another object of the present invention is to provide a method of fabricating an active matrix organic electroluminescent display device having improved endurance and reliability.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To, achieve these and other advantages and in accordance with the purpose of the present invention, as embodied and broadly described, an active matrix organic electroluminescent display device includes a substrate including a light emitting region having sub pixel regions, a plurality of switching elements on the substrate in the sub pixel regions, a first passivation layer covering the plurality of switching elements and having a plurality of first contact holes exposing the plurality of switching elements, a plurality of first electrodes on the first passivation layer, each first electrode connected to each switching element through each first contact hole, a second passivation layer on the plurality of first electrodes, the second passivation layer having a plurality of openings exposing the plurality of first electrodes and covering edge portions of the plurality of first electrodes, a plurality of organic electroluminescent layers on the second passivation layer, each organic electroluminescent layer contacting each first electrode through each opening, and a second electrode on the plurality of organic electroluminescent layers, wherein the first passivation layer is made of a first organic material having a planarized upper surface and the second passivation layer is made of a second organic material having a formation temperature lower than a formation temperature of inorganic materials.

In another aspect, a method of fabricating an active matrix organic electroluminescent display device includes steps of forming a switching element on a substrate having sub pixel regions, forming a first passivation layer of a first organic material on the switching element, the first passivation layer includes a first contact hole to expose the switching element, forming a first electrode on the first passivation layer in the sub pixel regions, the first electrode connected to the switching element through the first contact hole, forming a second passivation layer of a second organic material on the first electrode, the second passivation layer having an opening to expose the first electrode and covering edge portions of the first electrode, forming an organic electroluminescent layer on the second passivation layer in the sub pixel regions, the organic electroluminescent layer contacting the first electrode through the opening, and forming a second electrode on the organic electroluminescent layer, wherein the first passivation layer includes a first organic material having a planarized upper surface and the second passivation layer includes a second organic material having a formation temperature lower temperatures than a formation temperature of inorganic materials.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the illustrated embodiments of the present invention, an example of which is illustrated in the accompanying drawings.

Figure 1:
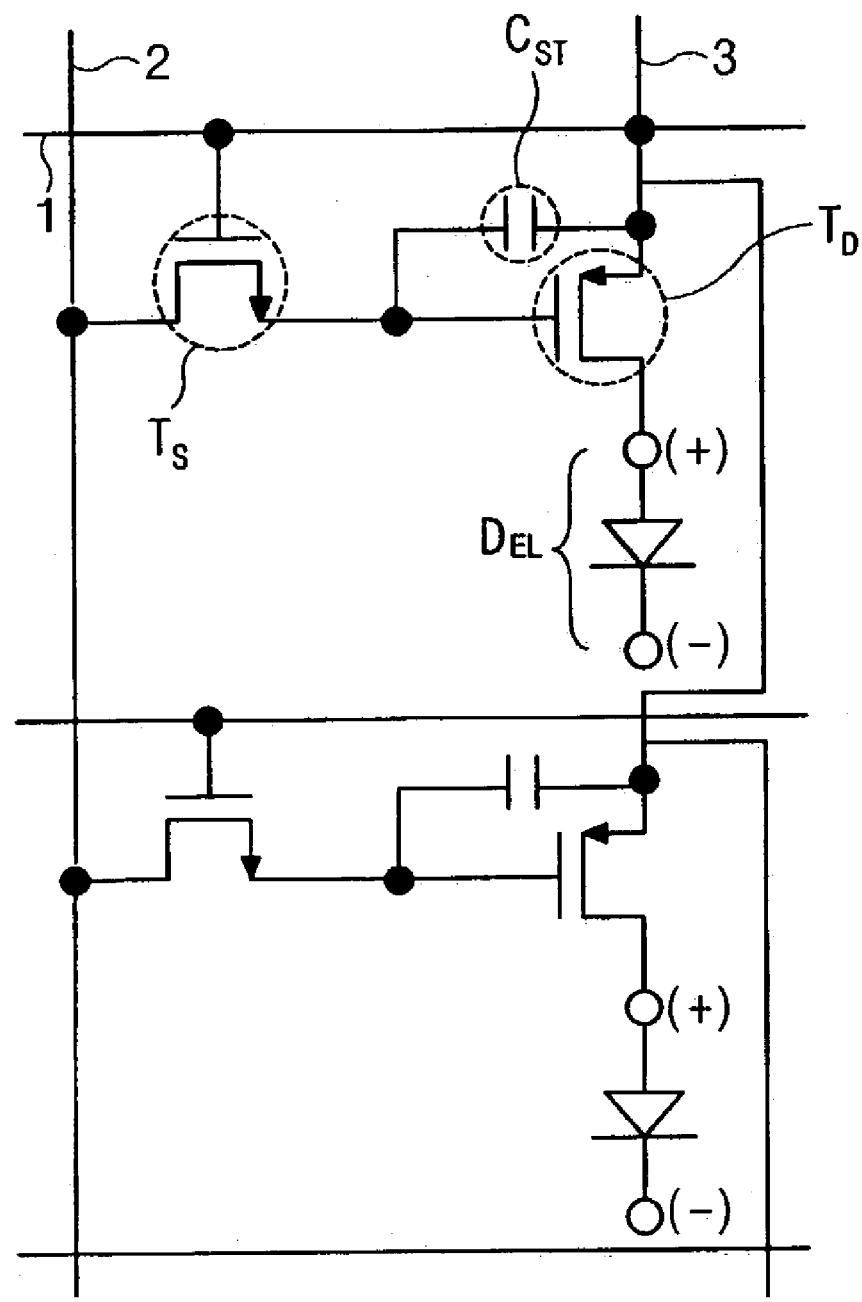
FIG. 1 is a schematic circuit diagram of a pixel structure of an active matrix-type OELD device according to the related art.
Figure 2:
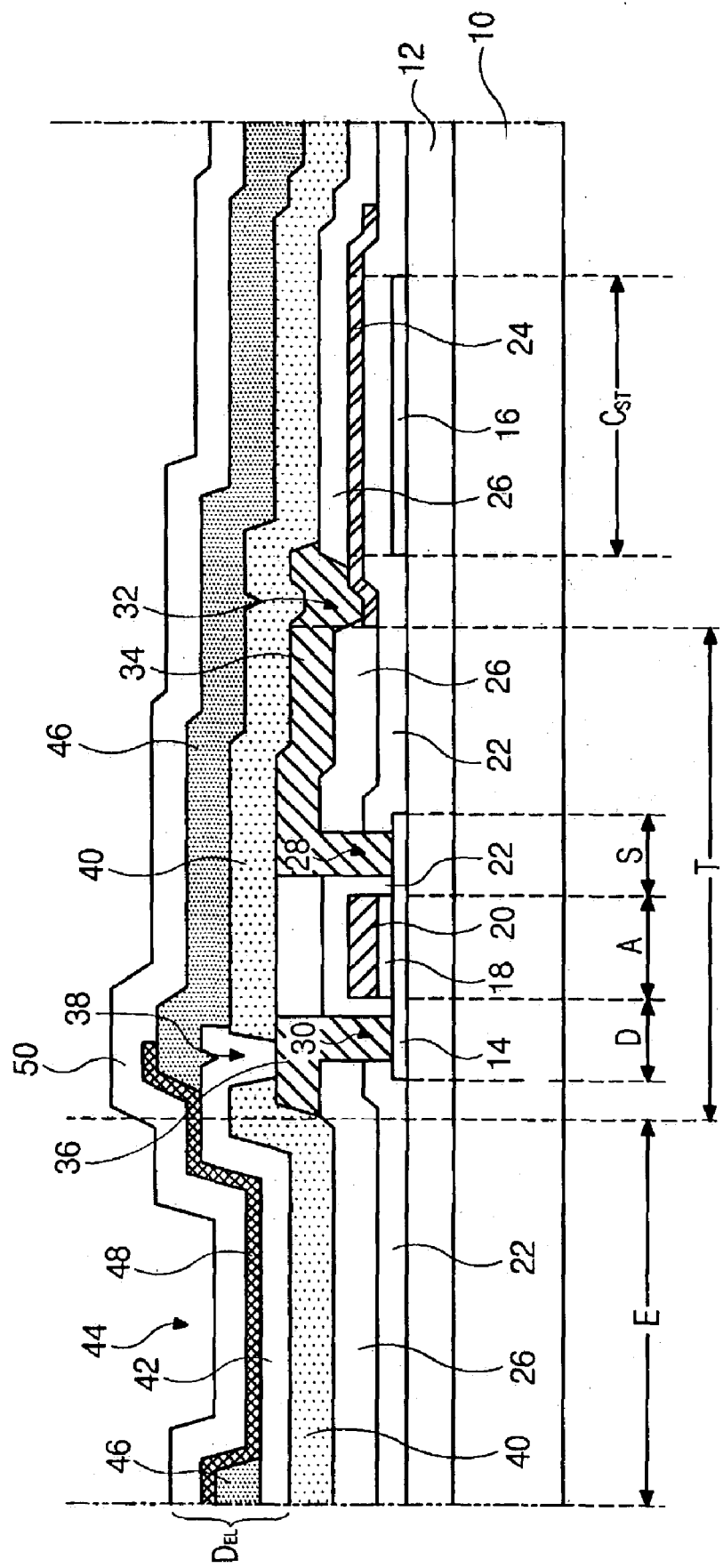
FIG. 2 is a cross sectional view of an active matrix-type OELD device according to the related art.
Figure 3:
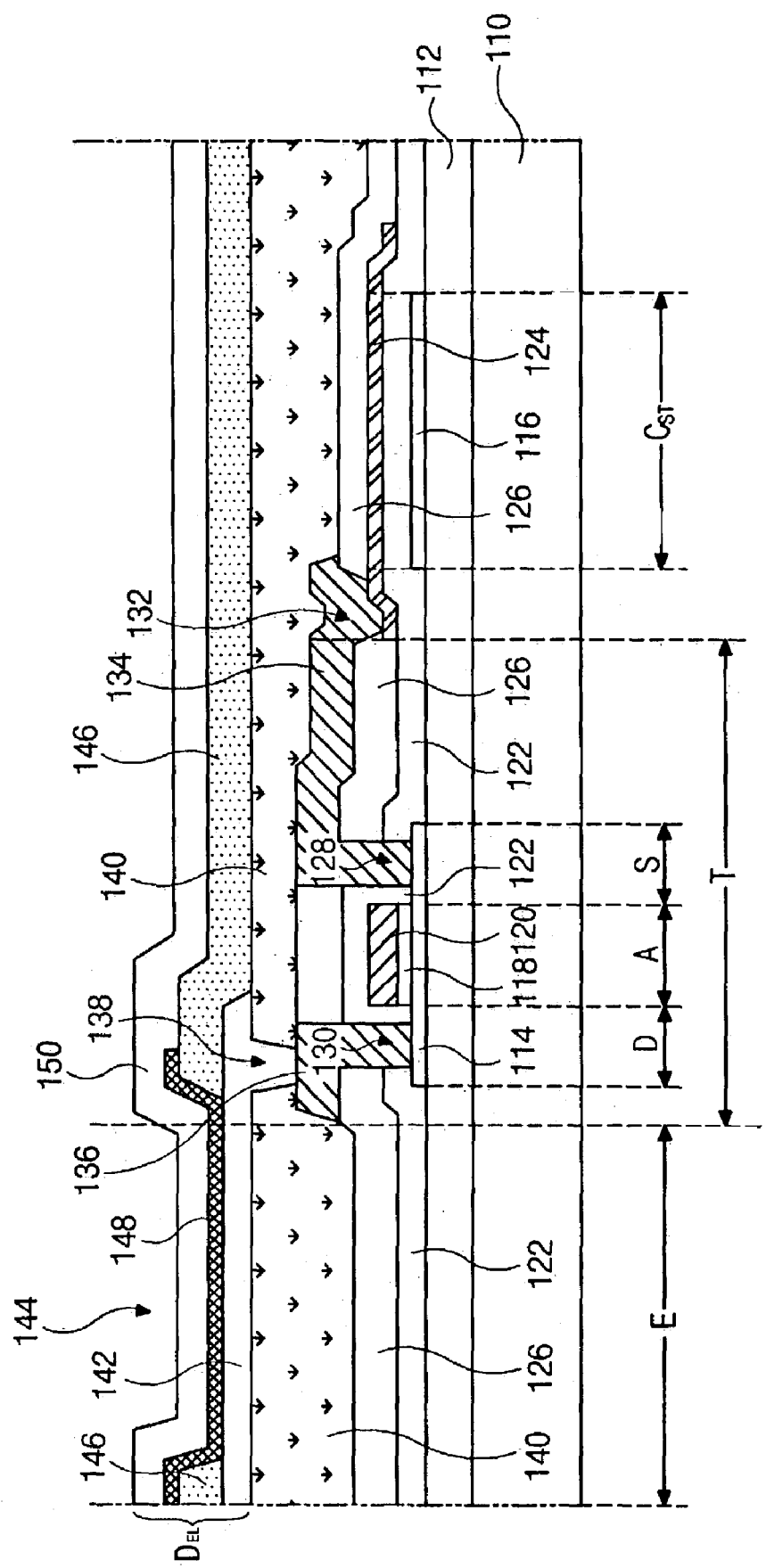
FIG. 3 is a cross sectional view of an exemplary active matrix-type OELD device according to the present invention.

FIG. 3 is a cross sectional view of an exemplary active matrix-type OELD device according to the present invention. In FIG. 3, a buffer layer 112 may be formed on a substrate 110, which may include a light emitting region E for forming an image, and a thin film transistor T may be formed on the buffer layer 112. In addition, an organic electroluminescent (EL) diode $D_{EL}$ may be formed in the light emitting region E and may be connected to first part of the thin film transistor T, and a storage capacitor $C_{ST}$ may be formed that is connected to a second part of the thin film transistor T.

In FIG. 3, a semiconductor layer 114 and a first capacitor electrode 116 may be formed on the buffer layer 112, and a gate insulating layer 118 and a gate electrode 120 may be subsequently formed on a central portion of the semiconductor layer 114. In addition, a first interlayer 122 may be formed on an entire surface of the substrate 110 to cover the gate electrode 120 and the first capacitor electrode 116. Furthermore, a second capacitor electrode 124 may be formed on the first interlayer 122 corresponding to the first capacitor electrode 116, wherein the second capacitor electrode 124 may branch off from a power line (not shown), and a second interlayer 126 may be formed on an entire surface of the substrate 110 including the second capacitor electrode 124.

Although not shown, a gate line connected to the gate electrode 120, which may be referred to as a scanning line, may be formed along a first direction, and a power line connected to the second capacitor electrode 124 may be formed along a second direction crossing the gate line. Accordingly, the gate electrode 120 may be connected to a drain electrode of a switching thin film transistor (not shown) of the active matrix-type OELD device.

In FIG. 3, the semiconductor layer 114 may include an active region A that may correspond to the gate insulating layer 118 and the gate electrode 120, and source and drain regions S and D that may be disposed at both sides of the active region A. The semiconductor layer 114 and the first capacitor electrode 116 may include crystalline silicon, such as polycrystalline silicon. The active region A of the semiconductor layer 114 may correspond to an intrinsic semiconductor region, and the source and drain regions S and D of the semiconductor layer 114 and the first capacitor electrode 116 may correspond to an ion-doped semiconductor region.

The gate insulating layer 118, the first interlayer 122, and the second interlayer 126 may include insulating material(s). For example, the gate insulating layer 118 may be made of silicon nitride (SiNx), and the first and second interlayers 122 and 126 may be made of an inorganic material, such as silicon nitride, (SiNx) and silicon oxide ($SiO_2$). In addition, the first interlayer 122 and the second interlayer 126 may include a first contact hole 128 exposing the source region S of the semiconductor layer 114, and a second contact hole 130 exposing the drain region D of the semiconductor layer 114. The second interlayer 126 may also include a third contact hole 132 that exposes the second capacitor electrode 124, wherein the first and second capacitor electrodes 15 and 124 and the first interlayer 122 may be arranged to form the storage capacitor $C_{ST}$.

In FIG. 3, a source electrode 134 and a drain electrode 136 may be formed on the second interlayer 126, wherein the source electrode 134 may be connected to both the source region S of the semiconductor layer 1 14 through the first contact hole 128 and the second capacitor electrode 124 through the third contact hole 132, and the drain electrode 136 may be connected to the drain region D of the semiconductor layer 114 through the second contact hole 130. The source electrode 134 and the drain electrode 136 may include metal material(s) having strong chemical corrosion resistance, such as molybdenum (Mo), nickel (Ni), tungsten (W), and chromium (Cr).

A first passivation layer 140 may be formed on an entire surface of the substrate 110 including the source electrode 134 and the drain electrode 136,wherein the first passivation layer 140 may have a fourth contact hole 138 exposing the drain electrode 136. In addition, a first electrode 142 may be formed on the first passivation layer 140 in the light emitting region E, and may be connected to the drain electrode 136 through the fourth contact hole 138. Although not shown, the first electrode 142 may be patterned in each sub pixel area.

Accordingly, the first passivation layer 140 may be made of organic material(s) having a planarized surface to improve surface properties of the first electrode 142. For example, the first passivation layer 140 may be made of one of benzocyclobutene (BCB), poly acrylate, and polyimide. Since these organic layers may be formed by a spin coating method, the organic layers may not be significantly influenced by topologies of the under layers. Accordingly, upper surfaces of the organic materials may be easily planarized. For example, the first passivation layer 140 may have a thickness of more than about 1 µm, and may be within a range of about 1 µm to about 10 µm.

In FIG. 3, a second passivation layer 146 may be formed on the first electrode 142, wherein the second passivation layer 146 may include an opening 144 to expose the first electrode 142. To prevent leakage current from being generated at edge portions of the first electrode 142, the second passivation layer 146 may be formed to cover the edge portions of the first electrode 142. The second passivation layer 146 may be made of organic material(s) that may be formed at relatively low temperatures, such as a photoresist material, polyacrylate, polyimide, and benzocyclobutene (BCB).

In FIG. 3, an organic electroluminescent layer 148 may be formed on the second passivation layer 146 in the light emitting region E to contact the first electrode 142 through the opening 144. Next, a second electrode 150 may be formed on an entire surface of the substrate 110 including the organic electroluminescent layer 148. Accordingly, the first and second electrodes 142 and 150 and the organic electroluminescent layer 140 interposed between the first and second electrodes 142 and 150 form the organic EL diode $D_{EL}$.

According to the present invention, the first passivation layer 140, which is an under layer of the organic EL diode $D_{EL}$ and contacts the organic EL diode $D_{EL}$, and the second passivation layer 146, which covers the edge portions of the first electrode 142 and is disposed between the first and second electrodes 142 and 150, are made of an organic material. If the first and second passivation layers 140 and 146 are made of the same organic material, the first passivation layer 140 may be etched by an etchant of the second passivation layer 146 when the second passivation layer 146 is formed, and the first electrode 142 between the first and second passivation layers 140 and 146 may be damaged. Thus, the first and second passivation layers 140 and 146 are made of different organic material(s).

Since polyimide materials adhere well to a transparent conducting material, such as indium-tin-oxide, as compared with other organic materials, it is beneficial that an imidization rate of the polyimide materials, which is a rate of a compound having an imino group (NH) in the polyimide, is more than about 95%. Since the polyimide of the imidization rate has high coherence, the polyimide minimizes effects by processes for forming other organic material(s). Accordingly, since the first electrode 142 may be damaged if the first and second passivation layers 140 and 146 are made of the same material, it is beneficial that the polyimide material(s) be used as only either the first passivation layer 140 or the second passivation layer 146. Moreover, the polyimide material may be used as the first passivation layer 140, and an effect on the first passivation layer 140 from a solvent of the second passivation layer 146 may be minimized during the process of forming the second passivation layer 146.

Although the second passivation layer 146 including the opening 144 may be formed of inorganic material(s), changes in surface properties of the first electrode 142, which may be made of indium-tin-oxide and may be exposed by the opening, may be reduced. If the first electrode 142 and the second electrode 146 function as an anode electrode and a cathode electrode, respectively, and light from the organic electroluminescent layer 148 is emitted through the second electrode 150, the OELD device may be considered a top emission-type OELD device, and the second electrode 150 may be made of a transparent conducting material.

Figure 4:
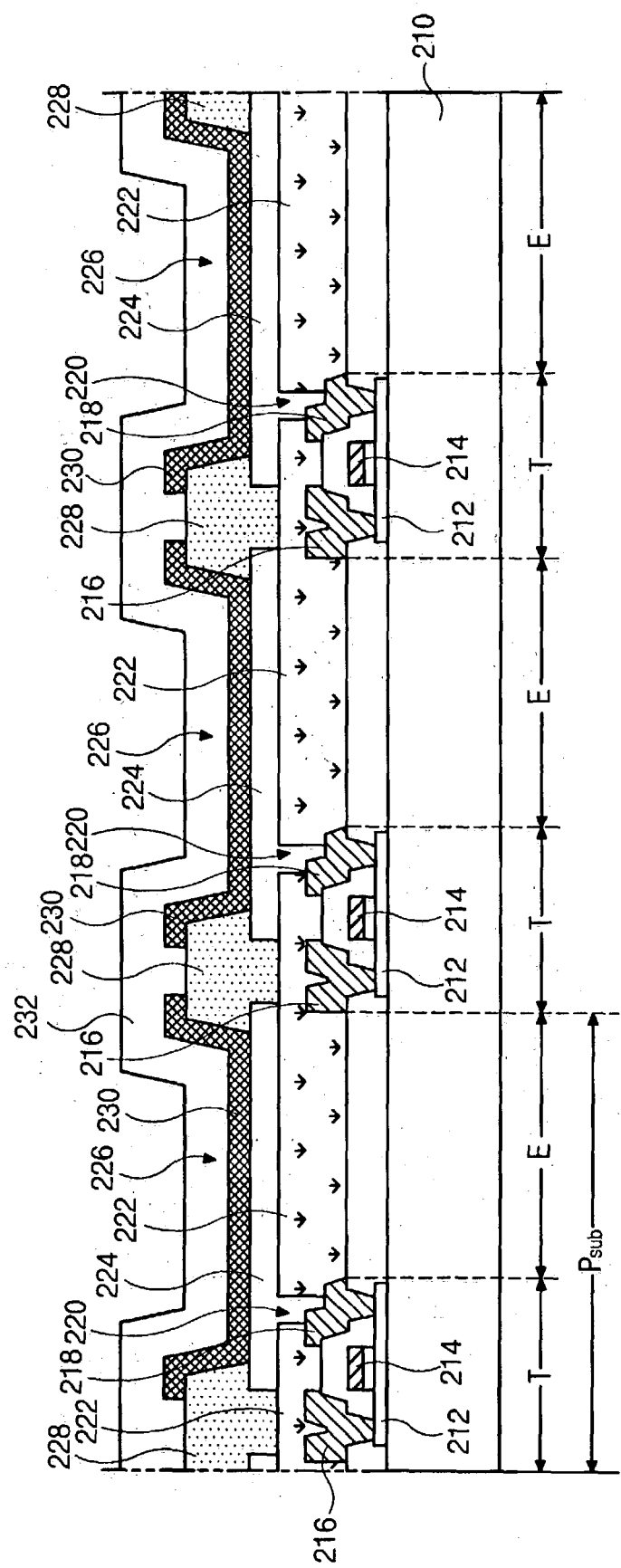
FIG. 4 is a cross sectional view of another active matrix-type OELD device according to the present invention.

FIG. 4 is a cross sectional view of another active matrix-type OELD device according to the present invention. In FIG. 4, a light emitting region E may be defined on a substrate 210 by sub pixel regions Psub, and a thin film transistor T that may include a semiconductor layer 212, a gate electrode 214, a source electrode 216 and a drain electrode 218 formed on the substrate 210. In addition, a first passivation layer 222 made of a first organic material may be formed on an entire surface of the substrate 210 including the thin film transistor T, wherein the first passivation layer 222 may include a drain contact hole 220 to expose the drain electrode 218. Moreover, a first electrode 224 may be formed on the first passivation layer 222, and may be connected to the drain electrode 218 through the drain contact hole 220.

A second passivation layer 228, which may include second organic material(s), may be formed on the first electrode 224 to cover edge portions of the first electrode 224, and may have an opening 226 to expose the first electrode 224. In addition, an organic electroluminescent layer 230 may be formed on the second passivation layer 228 and may contact the first electrode 224 through the opening 226. Moreover, a second electrode 232 may be formed on an entire surface of the substrate 210 including the organic electroluminescent layer 230.

The first organic material may be selected from organic material(s) having good planarization characteristics, such as benzocylobutene, polyacrylate, and polyimide, and the second organic material may be one of a photoresist material, polyacrylate, polyimide, and benzocyclobutene (BCB). Since the organic material(s) may be hardened at temperatures lower than hardening temperatures of inorganic material(s), the second organic material may be selected from organic material(s) having a formation temperature lower than a formation temperature of the first organic material, wherein the formation temperature may include baking and curing temperatures after coating the organic material. If the formation temperature of the second organic material is relatively high, then the first organic material may be hardened too much and defects may be easily formed due to degeneration of the organic material layer. Accordingly, the first organic material and the second organic material may be formed of different materials, wherein the first organic material may include polyimide material(s) such that the imidization rate of the polyimide may be over 95%.

Figure 5:
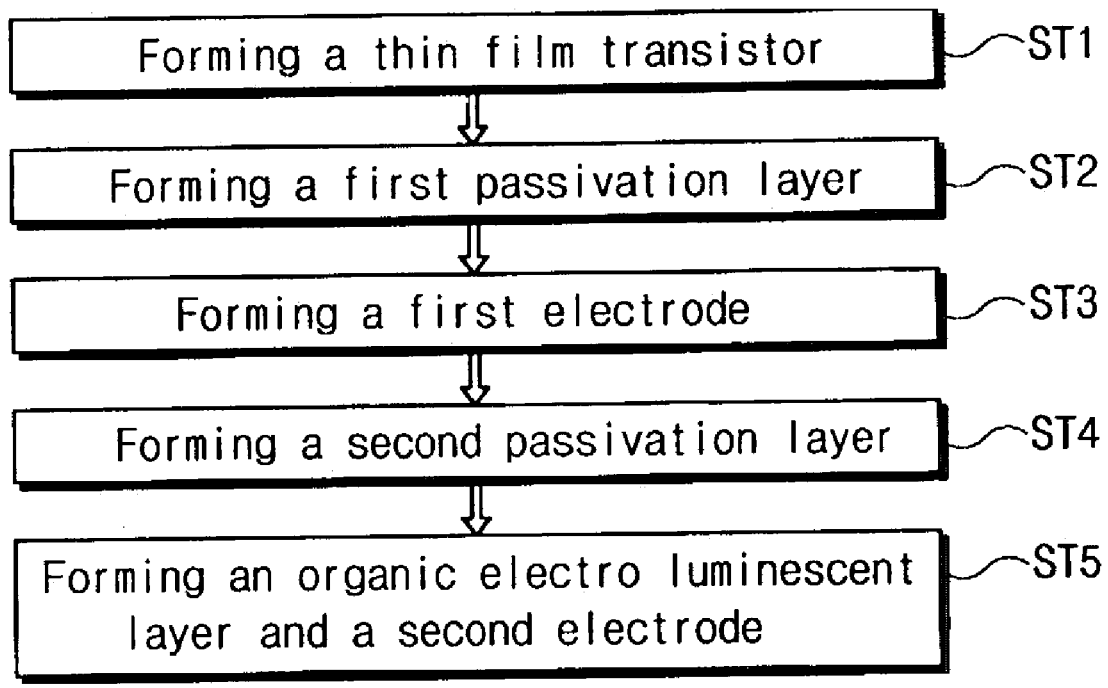
FIG. 5 is a flow chart of an exemplary method of fabricating an active matrix-type OELD device according to the present invention.

FIG. 5 is a flow chart of an exemplary method of fabricating an active matrix-type OELD device according to the present invention. In FIG. 5, a step ST1 may include formation of a thin film transistor on a substrate, which may include sub pixel areas. The thin film transistor may include a driving thin film transistor connected to an organic electroluminescent diode and a switching thin film transistor connected to a gate line and a data line.

A step ST2 may include forming a first passivation layer on an entire surface of the substrate including the thin film transistor. The first passivation layer may be made of a first organic material and may include a first contact hole to expose a part of the thin film transistor.

A step ST3 may include forming a first electrode on the first passivation layer, wherein the first electrode may be connected to the thin film transistor through the first contact hole.

A step ST4 may include forming a second passivation layer on the first electrode, wherein the second passivation layer may be made of a second organic material. In addition, the second passivation layer may include an opening to expose the first electrode and to cover edge portions of the first electrode.

A step ST5 may include forming an organic electroluminescent layer on the second passivation layer, and forming a second electrode on an entire surface of the substrate including the organic electroluminescent layer. Accordingly, the organic electroluminescent layer may be connected to the first electrode through the opening.

For example, the first organic material and the second organic material may be selected from different organic materials. If either the first organic material or the second organic material is selected from polyimide material(s), the imidization rate of the polyimide material(s) may be more than 95%. For example, the polyimide material(s) may be used as the first organic material.

According to the present invention, the active matrix-type OELD device may be advantageous since the passivation layer may be formed by a spin coating method, the passivation layer may have a larger thickness than an inorganic layer using a chemical vapor deposition method. In addition, the passivation layer may have a highly planarized surface since the topologies of the under layers have little effect on the upper surface of the passivation layer. Accordingly, an electrical short between electrodes of the organic electroluminescent device may be prevented.

Moreover, damage of the under layers may be reduced since the organic layer may be formed at temperatures lower than formation temperatures for inorganic material layers. Furthermore, since the organic material(s) used have highly planarized upper surfaces, an overall thickness of the device may be increase, thereby improving endurance and reliability of the device.

It will be apparent to those skilled in the art that various modifications and variations can be made in the organic electroluminescent display device and the method of fabricating the organic electroluminescent display device of the present invention without departing from the spirit or scope of the inventions. Thus, it is intended that the present invention covers the modifications and variations of this invention provided they come within the scope of the appended claims and their equivalents.

What is claimed is:

1. An active matrix organic electroluminescent display device, comprising:
    a substrate including a light emitting region having sub pixel regions;
    a plurality of switching elements on the substrate in the sub pixel regions;
    a first passivation layer covering the plurality of switching elements and having a plurality of first contact holes exposing the plurality of switching elements;
    a plurality of first electrodes on the first passivation layer, each first electrode connected to each switching element through each first contact hole;
    a second passivation layer on the plurality of first electrodes, the second passivation layer having a plurality of openings exposing the plurality of first electrodes and an end portion covering edge portions of the plurality of first electrodes;
    a plurality of organic electroluminescent layers on the second passivation layer, each organic electroluminescent layer contacting each first electrode through each opening; and
    a second electrode on the plurality of organic electroluminescent layers,
    wherein the first passivation layer is made of a first organic material having a planarized upper surface and the second passivation layer is made of a second organic material having a formation temperature lower than a formation temperature of the first organic material, and the end portion of the second passivation is disposed between a terminal end portion of each of the plurality of organic electroluminescent layers and a terminal end portion of each of the plurality of first electrodes.

2. The device according to claim 1, wherein the first organic material includes at least one of benzocyclobutene, polyacrylate, and polyimide.

3. The device according to claim 2, wherein the polyimide has an imidization rate of more than about 95%.

4. The device according to claim 1, wherein the second organic material includes at least one of photoresist, benzocyclobutene, polyacrylate, and polyimide.

5. The device according to claim 4, wherein the polyimide has an imidization rate of more than about 95%.

6. The device according to claim 1, wherein the plurality of first electrodes function as an anode electrode and the second electrode functions as a cathode electrode.

7. The device according to claim 6, wherein light produced by the organic electroluminescent layer is transmitted through the second electrode.

8. The device according to claim 7, wherein the second electrode includes transparent conducting material.

9. The device according to claim 1, wherein each switching element includes a semiconductor layer having an active region and source and drain regions, a gate electrode disposed over the active region, a source electrode connected to the source region, and a drain electrode connected to the drain region.

10. The device according to claim 9, further comprising a plurality of storage capacitors electrically connected to the plurality of switching elements.

11. The device according to claim 10, wherein each storage capacitor includes a first capacitor electrode made of the same material as the semiconductor layer and a second capacitor electrode connected to the source electrode.

12. The device according to claim 1, wherein the first and second passivation layers are formed by a spin coating method.

13. The device according to claim 1, wherein the first passivation layer has a thickness within a range of about 1 μm to about 10 μm.

14. The device according to claim 1, wherein the first and second passivation layers are made of different organic materials.

15. A method of fabricating an active matrix organic electroluminescent display device, comprising steps of:
    forming a switching element on a substrate having sub pixel regions;
    forming a first passivation layer of a first organic material on the switching element, the first passivation layer includes a first contact hole to expose the switching element;

forming a first electrode on the first passivation layer in the sub pixel regions, the first electrode connected to the switching element through the first contact hole;

forming a second passivation layer of a second organic material on the first electrode, the second passivation layer having an opening to expose the first electrode and an end portion covering edge portions of the first electrode;

forming an organic electroluminescent layer on the second passivation layer in the sub pixel regions, the organic electroluminescent layer contacting the first electrode through the opening; and forming a second electrode on the organic electroluminescent layer, wherein the first passivation layer includes a first organic material having a planarized upper surface and the second passivation layer includes a second organic material having a formation temperature lower than a formation temperature of the first organic material, and the end portion of the second passivation is disposed between a terminal end portion of each of the plurality of organic electroluminescent layers and a terminal end portion of each of the plurality of first electrodes.

16. The method according to claim 15, wherein the first and second passivation layers are formed by a spin coating method.

17. The method according to claim 15, wherein one of the first and second organic materials include polyimide.

18. The method according to claim 17, wherein the polyimide has an imidization rate of more than about 95%.

19. The method according to claim 15, wherein the switching element includes a semiconductor layer having an active region and source and drain regions, a gate electrode disposed over the active region, a source electrode connected to the source region, and a drain electrode connected to the drain region.

20. The method according to claim 19, further comprising forming a storage capacitor electrically connected to the switching element.

21. The method according to claim 20, wherein the storage capacitor includes a first capacitor electrode made of the same material as the semiconductor layer and a second capacitor electrode connected to the source electrode.

22. The method according to claim 15, wherein the first passivation layer has a thickness within a range of about 1 µm to about 10 µm.

23. The method according to claim 15, wherein the first and second passivation layers are made of different organic materials.

* * * * *